United States Patent [19]

Takasaki

[11] Patent Number: 5,424,243
[45] Date of Patent: Jun. 13, 1995

[54] METHOD OF MAKING A COMPOUND SEMICONDUCTOR CRYSTAL-ON-SUBSTRATE STRUCTURE

[75] Inventor: Kanetake Takasaki, Kawasaki, Japan

[73] Assignee: Fujitsu Limited, Kawasaki, Japan

[21] Appl. No.: 302,439

[22] Filed: Sep. 9, 1994

[30] Foreign Application Priority Data

Sep. 20, 1993 [JP] Japan ................................. 5-233506

[51] Int. Cl.$^6$ ........................................... H01L 21/20
[52] U.S. Cl. .................................... 437/132; 437/105; 437/107; 437/133; 437/248; 437/174
[58] Field of Search ............... 437/132, 105, 107, 174, 437/248, 133

[56] References Cited

U.S. PATENT DOCUMENTS

| | | | |
|---|---|---|---|
| 5,011,550 | 4/1991 | Konushi et al. | 437/132 |
| 5,037,774 | 8/1991 | Yamawaki et al. | 117/8 |
| 5,168,069 | 12/1992 | Smith et al. | 437/133 |
| 5,210,052 | 5/1993 | Takasaki | 437/132 |

FOREIGN PATENT DOCUMENTS 0101736  4/1990  Japan ................................. 437/132

Primary Examiner—Nam Nguyen
Assistant Examiner—Ramamohan Rao Paladugu
Attorney, Agent, or Firm—Armstrong, Westerman, Hattori, McLeland & Naughton

[57] ABSTRACT

A method of producing a compound semiconductor crystal-on-substrate structure includes forming a first compound semiconductor crystal layer made of a group III–V compound semiconductor on a Si substrate, forming a stacked structure by forming an amorphous compound semiconductor layer made of the group III–V compound semiconductor on the first compound semiconductor crystal layer, subjecting the stacked structure to a thermal process, removing at least the amorphous compound semiconductor layer from the stacked structure that is subjected to the thermal process, and forming a second compound semiconductor crystal layer made of the group III–V compound semiconductor, to thereby form the compound semiconductor crystal-on-substrate structure.

10 Claims, 4 Drawing Sheets

METHOD OF MAKING A COMPOUND SEMICONDUCTOR CRYSTAL-ON-SUBSTRATE STRUCTURE

BACKGROUND OF THE INVENTION

The present invention generally relates to compound semiconductor crystal-on-substrate structures and methods of producing the same, and more particularly to a compound semiconductor crystal-on-substrate structure having a group III–V compound semiconductor layer such as a GaAs layer formed on a Si substrate and to a method of producing such a compound semiconductor crystal-on-substrate structure.

Semiconductor devices using a group III–V compound semiconductor crystal layer such as a GaAs crystal layer can operate at a high speed compared to semiconductor devices using Si, because of the large carrier mobility. In addition, the bandgap enables emission of visible light, thereby making the semiconductor devices using the group III–V compound semiconductor crystal layer extremely useful. However, it is difficult to produce a substrate having a large diameter for the semiconductor devices using the group III–V compound semiconductor crystal layer, and the mechanical strength of the substrate is poor. For this reason, the development of the semiconductor devices using the group III–V compound semiconductor crystal layer has been slow compared to the development of the semiconductor devices using Si.

Accordingly, proposals have been made to grow a GaAs crystal layer on a Si substrate which has a satisfactory mechanical strength and can be made to a relatively large diameter. According to such proposals, a light emitting diode (LED), a laser, a field effect transistor (FET) or the like is formed on the GaAs crystal layer.

However, considerable crystal defects existed in the group III–V compound semiconductor crystal layer such as the GaAs crystal layer that is formed on the Si substrate according to the above proposals. For this reason, it was impossible to produce the LED, laser, FET or the like having satisfactory characteristics using the group III–V compound semiconductor crystal layer.

In order to reduce the crystal defects in the group III–V compound semiconductor crystal layer such as the GaAs crystal layer formed on the Si substrate, it was conceivable to first form the group III–V compound semiconductor crystal layer to a desired thickness on the Si substrate, and then carry out a cyclic thermal process. Alternatively, it was conceivable to first form the GaAs crystal layer to approximately one-half the desired thickness on the Si substrate, then carry out a cyclic annealing process, and continue growing the GaAs crystal layer to the desired thickness.

However, according to such conceivable methods, it was difficult to reduce the crystal defect density to $1 \times 10^6$ cm$^{-2}$ or less.

SUMMARY OF THE INVENTION

Accordingly, it is a general object of the present invention to provide a novel and useful compound semiconductor crystal-on-substrate structure and a method of producing the same, in which the problems described above are eliminated.

Another and more specific object of the present invention is to provide a method of producing a compound semiconductor crystal-on-substrate structure comprising the steps of (a) forming a first compound semiconductor crystal layer made of a group III–V compound semiconductor on a Si substrate, (b) forming a stacked structure by forming an amorphous compound semiconductor layer made of the group III–V compound semiconductor on the first compound semiconductor crystal layer, (c) subjecting the stacked structure to a thermal process, (d) removing at least the amorphous compound semiconductor layer from the stacked structure that is subjected to the thermal process, and (e) forming a second compound semiconductor crystal layer made of the group III–V compound semiconductor, thereby forming the compound semiconductor crystal-on-substrate structure. According to the method of the present invention, it is possible to produce a compound semiconductor crystal-on-substrate structure in which the crystal defect density of the compound semiconductor crystal layer is $1 \times 10^6$ cm$^{-2}$ or less. Hence, it is possible to produce compound semiconductor crystal-on-substrate structures for use with a compound semiconductor LED, a compound semiconductor laser, a compound semiconductor FET and the like at a high reproducibility. Therefore, it will become possible to more easily produce active elements and light emitting elements having high operation speeds using the compound semiconductor crystal-on-substrate structure.

Still another object of the present invention is to provide a compound semiconductor crystal-on-substrate structure comprising a Si substrate, a first compound semiconductor crystal layer made of a group III–V compound semiconductor and provided on the Si substrate, where the first compound semiconductor crystal layer has a crystal defect density of $1 \times 10^6$ cm$^{-2}$. Of less, and a second compound semiconductor crystal layer made of the group III–V compound semiconductor and provided on the first compound semiconductor crystal layer. According to the compound semiconductor crystal-on-substrate structure of the present invention, it is possible to obtain a compound semiconductor crystal-on-substrate structure in which the crystal defect density of the compound semiconductor crystal layer is $1 \times 10^6$ cm$^{-2}$ or less. Hence, it is possible to produce compound semiconductor crystal-on-substrate structures for use with a compound semiconductor LED, a compound semiconductor laser, a compound semiconductor FET and the like at a high reproducibility. Therefore, it will become possible to more easily produce active elements and light emitting elements having high operation speeds using the compound semiconductor crystal-on-substrate structure.

Other objects and further features of the present invention will be apparent from the following detailed description when read in conjunction with the accompanying drawings.

DESCRIPTION OF THE PREFERRED EMBODIMENTS

A description will be given of an embodiment of a method of producing a compound semiconductor crystal-on-substrate structure according to the present invention, by referring to FIGS. 1A through 1D.

Figure 1A:
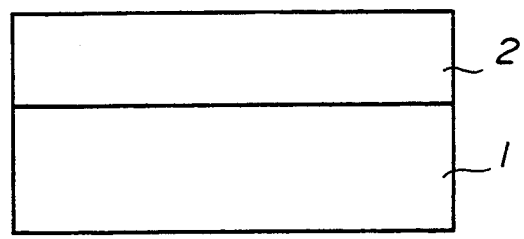
FIGS. 1A, 1B, 1C and 1D respectively are cross sectional views for explaining an embodiment of a method of producing a compound semiconductor crystal-on-substrate structure according to the present invention.

First, a trimethyl gallium (TMG) and arsine (ASH$_3$) are used to grow a GaAs crystal layer 2 to a thickness of 3.0 μm on a (100) face of a Si substrate 1 by a metal organic chemical vapor deposition (MOCVD) at a growth temperature of 650° C. and a growth pressure of 76 Torr, as shown in FIG. 1A.

Figure 1B:
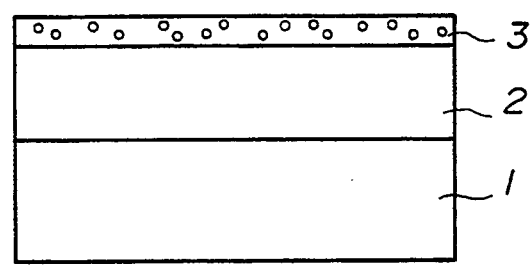

Second, an amorphous GaAs layer 3 is grown to a thickness of 500 Å to 5000 Å on the GaAs crystal layer 2 by a MOCVD at a growth temperature of 400° C. to 450° C. and a growth pressure of 76 Torr, as shown in FIG. 1B. It is desirable that the amorphous GaAs layer 3 is grown at a temperature of 500° C. or less in order to prevent polycrystallization.

Figure 2:
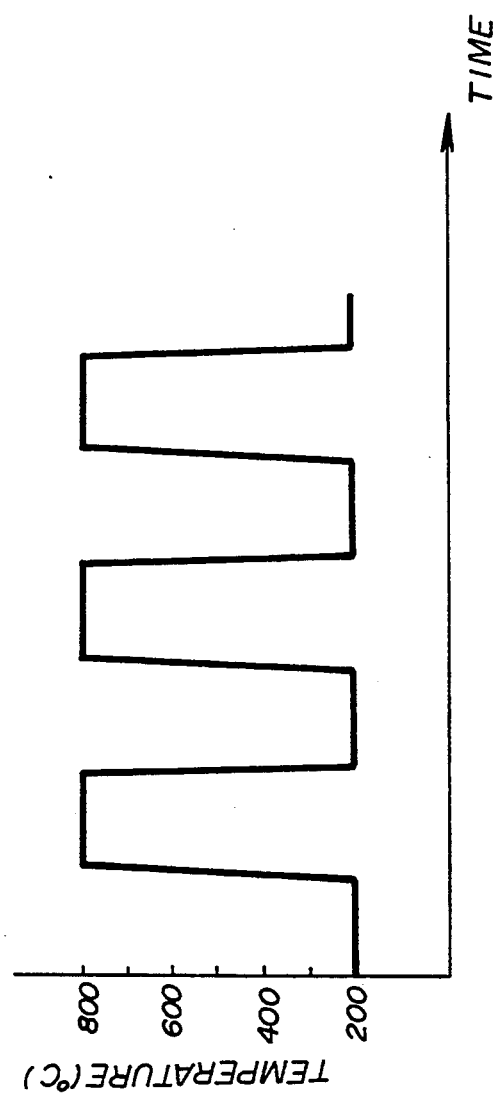
FIG. 2 is a diagram for explaining a cyclic annealing process used in the embodiment of the method.

Then, the stacked structure shown in FIG. 1B having the GaAs crystal layer 2 formed on the (100) face of the Si substrate 1 and the amorphous GaAs layer 3 formed on the GaAs crystal layer 2 is subjected to a cyclic annealing process. In this embodiment, the cyclic annealing process having a lower limit temperature of 200° C. and an upper limit temperature of 800° C. is carried out three times, as shown in FIG. 2. In FIG. 2, the ordinate indicates the temperature, and the abscissa indicates the time. By carrying out this cyclic annealing process, the crystal defects existing within the GaAs crystal layer 2 move to and are absorbed by the amorphous GaAs layer 3.

Figure 1C:
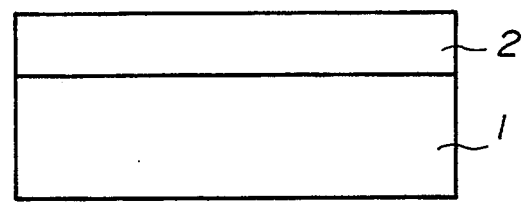

Third, the above stacked structure shown in FIG. 1B and subjected to the cyclic annealing process is removed from the growth chamber, and the top portion of the stacked structure on the side of the amorphous GaAs layer 3 is removed for a depth of 1.5 μm, for example, so as to at least remove the amorphous GaAs layer 3, as shown in FIG. 1C. The top portion of the stacked structure may be removed by a mechanical and/or chemical polishing process.

As a result, the GaAs layer 2 which is reduced of the crystal defects remains on the Si substrate 1 by the removal of the top portion of the stacked structure including the amorphous GaAs layer 3 for the depth of 1.5 μm.

Figure 1D:
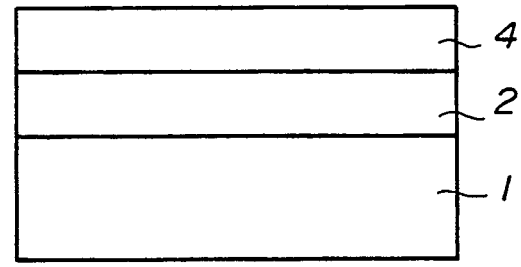

Fourth, a new GaAs crystal layer 4 is formed on the GaAs crystal layer 2 which is reduced of the crystal defects, as shown in FIG. 1D. This new GaAs crystal layer 4 is formed to a thickness of 1.5 μm, for example, under conditions similar to those when forming the GaAs crystal layer 2 in the first step described with reference to FIG. 1A.

As a result, it is possible to obtain a compound semiconductor crystal-on-substrate structure having a GaAs crystal layer formed on the (100) face of the Si substrate 1, where this GaAs crystal layer is made up of the GaAs crystal layer 2 and the new GaAs crystal layer 4, this crystal layer has a crystal defect density of $5 \times 10^5$ cm$^{-2}$ or less and this GaAs crystal layer has a thickness of 3 μm or greater.

Figure 3:
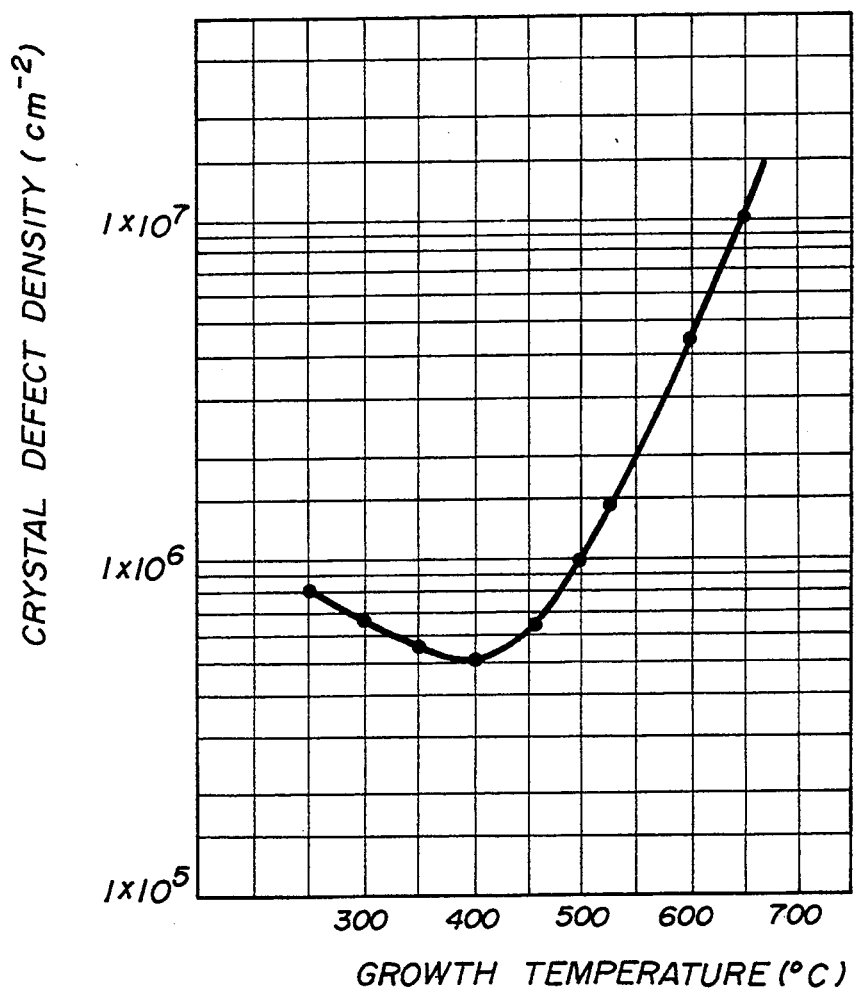
FIG. 3 is a graph showing the relationship between the crystal defect density of a GaAs crystal layer and the growth temperature of an amorphous GaAs layer in the embodiment of the method.

FIG. 3 is a graph showing the relationship between the crystal defect density of the GaAs crystal layer 2 and the growth temperature of the amorphous GaAs layer 3 in this embodiment.

In FIG. 3, the ordinate indicates the crystal defect density of the GaAs crystal layer 2, and the abscissa indicates the growth temperature of the amorphous GaAs layer 3.

It may be seen from FIG. 3 that the crystal defect density of the GaAs crystal layer 2 becomes $1 \times 10^6$ cm$^{-2}$ or less when the growth temperature of the amorphous GaAs layer 3 is 500° C. or less.

Figure 4:
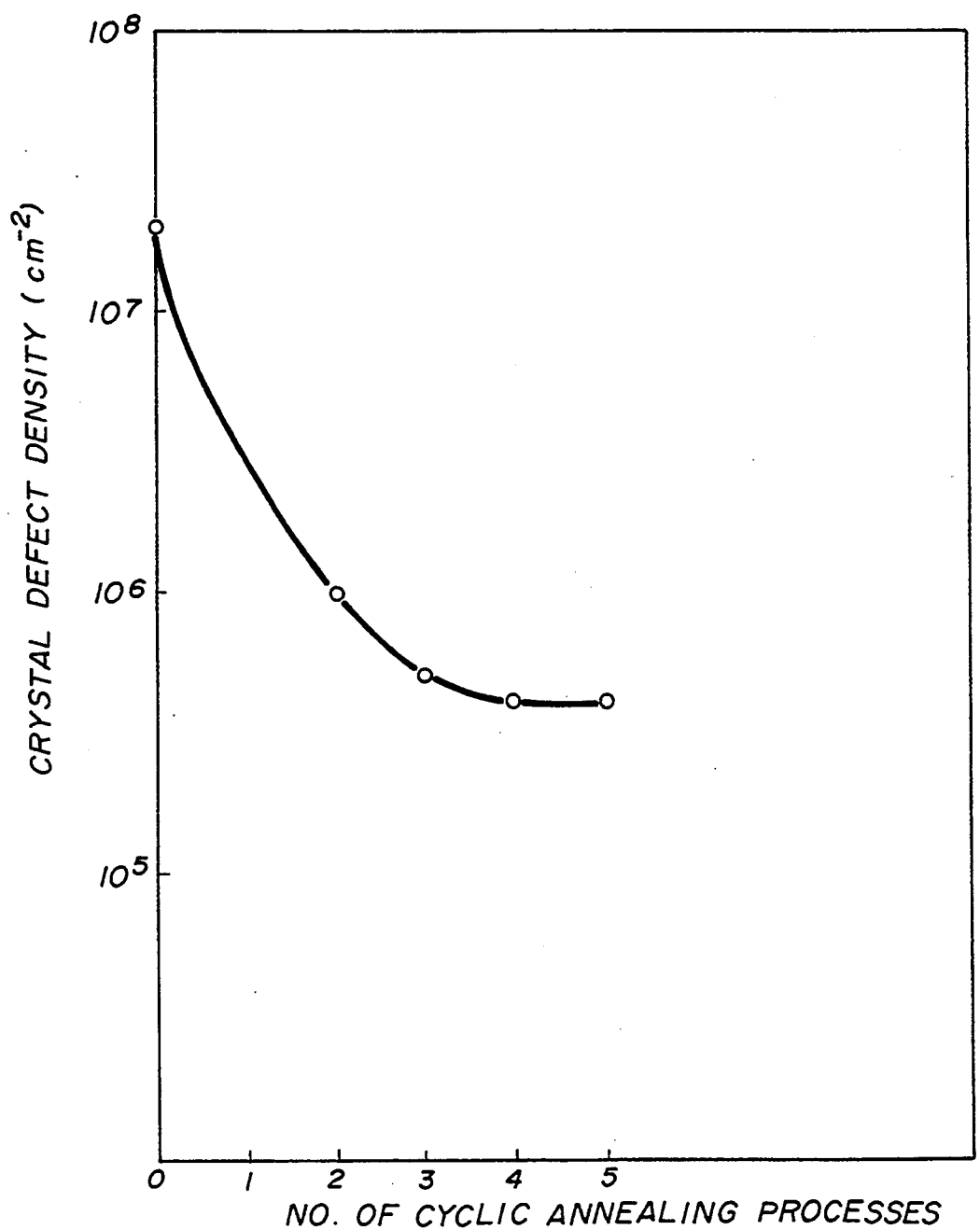
FIG. 4 is a graph showing the relationship between of the crystal defect density of the GaAs crystal layer and the number of cyclic annealing processes in the embodiment of the method.

FIG. 4 is a graph showing the relationship between of the crystal defect density of the GaAs crystal layer 2 and the number of cyclic annealing processes in this embodiment, where the upper limit temperature is 800° C. and the lower limit temperature is 200° C. as described above.

In FIG. 4, the ordinate indicates the crystal defect density of the GaAs crystal layer 2, and the abscissa indicates the number of cyclic annealing processes that are carried out with respect to stacked structure shown in FIG. 1B.

As may be seen from FIG. 4, the crystal defect density of the GaAs crystal layer 2 becomes $1 \times 10^6$ cm$^{-2}$ or less after two cyclic annealing processes.

According to the experiments conducted by the present inventor, it was found that the crystal properties within the GaAs crystal layer 2 are lost due to escaping As when the upper limit temperature of the cyclic annealing process exceeds 850° C. Furthermore, it was found that considerable time is required to raise and lower the temperature of the cyclic annealing process if the lower limit temperature is less than 150° C. Therefore, it was found that the upper limit temperature of the cyclic annealing process is desirably in a range of 750° C. to 850° C., and that the lower limit temperature of the cyclic annealing process is desirably in a range of 150° C. to 250° C.

In the embodiment described above, GaAs is formed on the Si substrate as an example of the compound semiconductor crystal layer. However, the present invention is similarly applicable to a case where a group III-V compound semiconductor crystal layer other than the GaAs crystal layer is formed on the Si substrate. For example, the group III-V compound semiconductor may be AlGaAs or the like.

Further, the present invention is not limited to these embodiments, but various variations and modifications may be made without departing from the scope of the present invention.

What is claimed is:

1. A method of producing a compound semiconductor crystal-on-substrate structure comprising the steps of:
   (a) deposit a first compound semiconductor crystal layer made of a group III-V compound semiconductor on a Si substrate;
   (b) deposit a stacked structure by forming an amorphous compound semiconductor layer made of said group III-V compound semiconductor on said first compound semiconductor crystal layer;
   (c) subjecting said stacked structure to a thermal process;
   (d) removing at least said amorphous compound semiconductor layer from said stacked structure that is subjected to said thermal process; and (e) forming a second compound semiconductor crystal layer made of said group III–V compound semiconductor, thereby forming the compound semiconductor crystal-on-substrate structure.

2. The method of producing a compound semiconductor crystal-on-substrate structure as claimed in claim 1, wherein said step (a) deposite said first compound semiconductor crystal layer by metal organic chemical vapor deposition.

3. The method of producing a compound semiconductor crystal-on-substrate structure as claimed in claim 1, wherein said step (b) deposite said amorphous compound semiconductor layer by metal organic chemical vapor deposition.

4. The method of producing a compound semiconductor crystal-on-substrate structure as claimed in claim 1, wherein said steps (a) and (b) respectively deposite said first compound semiconductor crystal layer and said amorphous compound semiconductor layer by metal organic chemical vapor deposition.

5. The method of producing a compound semiconductor crystal-on-substrate structure as claimed in claim 1, wherein said step (c) carries out an arbitrary number of cyclic annealing processes.

6. The method of producing a compound semiconductor crystal-on-substrate structure as claimed in claim 5, wherein said step (c) carries out each cyclic annealing process with an upper limit temperature in a range of 750° C. to 850° C. and a lower limit temperature in a range of 150° C. to 250° C.

7. The method of producing a compound semiconductor crystal-on-substrate structure as claimed in claim 1, wherein said step (c) carries out the thermal process so that a crystal defect density of said first compound semiconductor crystal layer is $1 \times 10^6$ cm$^{-2}$ or less.

8. The method of producing a compound semiconductor crystal-on-substrate structure as claimed in claim 1, wherein said step (d) removes at least said amorphous compound semiconductor layer by a mechanical and/or chemical polishing process.

9. The method of producing a compound semiconductor crystal-on-substrate structure as claimed in claim 1, wherein said step (e) deposite said second compound semiconductor crystal layer so that a compound semiconductor crystal layer formed by said first and second compound semiconductor crystal layer has a thickness of 3 μm or greater.

10. The method of producing a compound semiconductor crystal-on-substrate structure as claimed in claim 1, wherein said steps (a), (b) and (e) use said group III–V compound semiconductor selected from a group consisting of GaAs and AlGaAs.

* * * * *